US008994566B2

(12) United States Patent
Shiraishi et al.

(10) Patent No.: US 8,994,566 B2
(45) Date of Patent: Mar. 31, 2015

(54) DA CONVERTER

(71) Applicant: Kabushiki Kaisha Toshiba, Minato-ku, Tokyo (JP)

(72) Inventors: Kei Shiraishi, Tokyo (JP); Takeshi Ueno, Kawasaki (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/765,325

(22) Filed: Feb. 12, 2013

(65) Prior Publication Data
US 2013/0214953 A1    Aug. 22, 2013

(30) Foreign Application Priority Data
Feb. 22, 2012   (JP) .................... 2012-36699

(51) Int. Cl.
*H03M 1/66*     (2006.01)
*H03M 1/08*     (2006.01)
*H03M 1/74*     (2006.01)

(52) U.S. Cl.
CPC .............. *H03M 1/66* (2013.01); *H03M 1/0845* (2013.01); *H03M 1/742* (2013.01)
USPC ............. 341/144; 341/120; 341/153

(58) Field of Classification Search
CPC ............ H03M 1/0602; H03M 1/0604; H03M 1/0612; H03M 1/0614; H03M 1/0617; H03M 1/0678; H03M 1/068; H03M 1/08; H03M 1/109
USPC .................. 341/118, 120, 133, 136, 144
See application file for complete search history.

(56) References Cited

U.S. PATENT DOCUMENTS

| 4,542,332 A | | 9/1985 | van de Plassche |
| 5,258,757 A | * | 11/1993 | Reynolds ................. 341/136 |

(Continued)

FOREIGN PATENT DOCUMENTS

| JP | 59-134911 A | 8/1984 |
| JP | 59-167112 A | 9/1984 |

(Continued)

OTHER PUBLICATIONS

Background Art Information (concise explanation for US 2006/0092062), Toshiba, Jun. 8, 2012.

(Continued)

*Primary Examiner* — Howard Williams
(74) *Attorney, Agent, or Firm* — Knobbe, Martens, Olson & Bear LLP

(57) ABSTRACT

There is provided A DA converter in which the N current switch cells each include: a current source having one end connected to a first power source; and first and second switch transistors differentially operating each other, each having a control terminal receiving a digital signal, the first combining node combines a current output from the first switch transistor in each current switch cell, the second combining node combines a current output from the second switch transistor in each current switch cell, the first output impedance element has ends connected to the first combining node and a second power source, the second output impedance element has ends connected to the second combining node and the second power source, the controller controls the current source in each current switch cell to reduce variation in amount of a current flowing from the first power source.

8 Claims, 12 Drawing Sheets

(56) References Cited

U.S. PATENT DOCUMENTS

| | | | | |
|---|---|---|---|---|
| 5,703,582 | A | * 12/1997 | Koyama et al. | 341/120 |
| 5,917,360 | A | * 6/1999 | Yasutake | 327/387 |
| 6,577,260 | B2 | 6/2003 | Okada et al. | |
| 7,557,743 | B2 | * 7/2009 | Imai | 341/144 |
| 7,683,813 | B2 | * 3/2010 | Sugai | 341/120 |
| 7,782,236 | B2 | * 8/2010 | Kim | 341/136 |
| 8,193,960 | B2 | 6/2012 | Kuramochi | |
| 2006/0092062 | A1 | 5/2006 | Pan | |

FOREIGN PATENT DOCUMENTS

| | | | |
|---|---|---|---|
| JP | 08-204557 A | | 8/1996 |
| JP | 10-093436 A | | 4/1998 |
| JP | 2000-151404 A | | 5/2000 |
| JP | 2002-094378 A | | 3/2002 |
| JP | 2002-368619 A | | 12/2002 |
| JP | 2004080238 A | * | 3/2004 |
| JP | 2010-200274 A | | 9/2010 |
| JP | 2011-166745 A | | 8/2011 |
| JP | 2012-070088 A | | 4/2012 |

OTHER PUBLICATIONS

Notification of Reason for Rejection mailed by Japan Patent Office on Jun. 6, 2014 in the corresponding Japanese patent application No. 2012-036699—4 pages.

Notification of Reason for Rejection mailed by Japan Patent Office on Jan. 9, 2015 in the corresponding Japanese patent application No. 2012-036699—6 pages.

* cited by examiner

DA CONVERTER

CROSS REFERENCE TO RELATED APPLICATIONS

This application is based upon and claims the benefit of priority from the prior Japanese Patent Application No. 2012-36699, filed on Feb. 22, 2012, the entire contents of which are incorporated herein by reference.

FIELD

Embodiments described herein relate to a DA (digital to analogue) converter.

BACKGROUND

In a chip equipped with a digital circuit and a DAC (digital to analogue converter), a ground VSSC of a digital unit and a ground VSSA of the DAC are normally connected to a board with bonding wires. The bonding wire contains inductance components, so that voltages applied on both ends of the bonding wire vary every time AC currents flow. For example, currents flowing through the digital circuit during an operation of the digital unit flow in the inductance of the bonding wires, which causes variation in voltage of the VSSC. This variation in voltage is propagated through a back-to-back diode in the chip to the ground VSSA of the DAC.

One of problems in the related art is that, in a current steering DAC, variation in voltage (noises) propagated to the DAC is not cancelled, and thus noise components are contained in output analogue signals.

To address this problem, the following conventional solution is well known: a dummy path is provided along with a main path. In the case where noises of the ground are propagated through an emitter follower in the main path, so that the noises are applied to output signals, an emitter follower is also provided in the dummy path, and the same noise currents as those in the main path are generated. The respective differential output currents of the main path and the dummy path are combined each other with their polarities inverted. Consequently, the noise currents in the main path and the noise currents in the dummy path cancel each other due a differential relation, thereby reducing the noises.

In this conventional solution, matching between the main path and the dummy path is a crucial issue. Hence, there occurs a problem to reduce the variation in elements as small as possible. Mismatching between the parasitic capacitance value Cdp included in the main path and the parasitic capacitance value C'dp included in the dummy path may reduce noise cancelling effect.

DETAILED DESCRIPTION

A DA converter according to one embodiment includes N (N is an integer of 1 or more) current switch cells, a first combining node, a second combining node, a first output impedance element, a second output impedance element, and a controller.

The N current switch cells each include: a current source having one end connected to a first power source, which generates a controllable current; and a first switch transistor and a second switch transistor differentially operating each other, each of which having one end connected to another end of the current source and having a control terminal receiving a digital signal.

The first combining node combines currents output from another end of the first switch transistor in each current switch cell.

The second combining node combines currents output from another end of the second switch transistor in each current switch cell.

The first output impedance element has one end connected to the first combining node and another end connected to a second power source.

The second output impedance element has one end connected to the second combining node and another end connected to the second power source.

The controller controls the current source in each current switch cell to reduce variation in amount of a current flowing from the first power source.

Hereinafter, embodiments will be described with reference to the drawings.

(First Embodiment)

Figure 1:
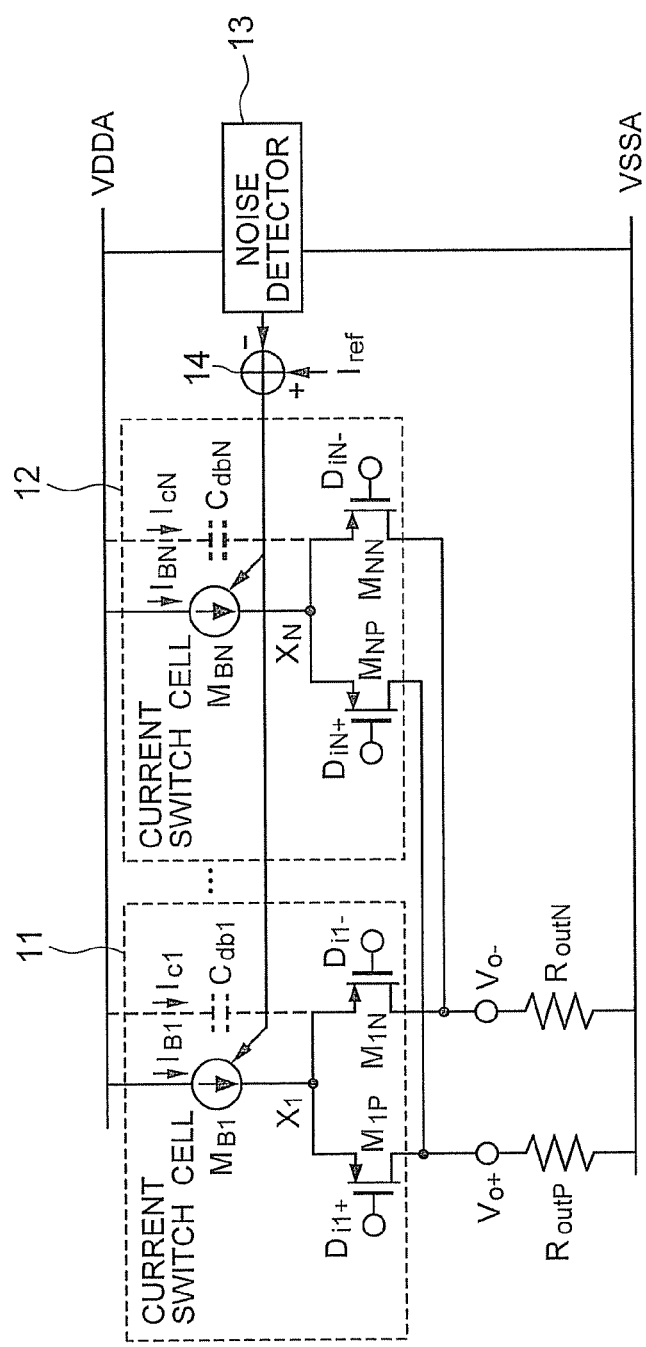
FIG. 1 is a circuit diagram showing a current steering DAC according to an embodiment.
Figure 12:
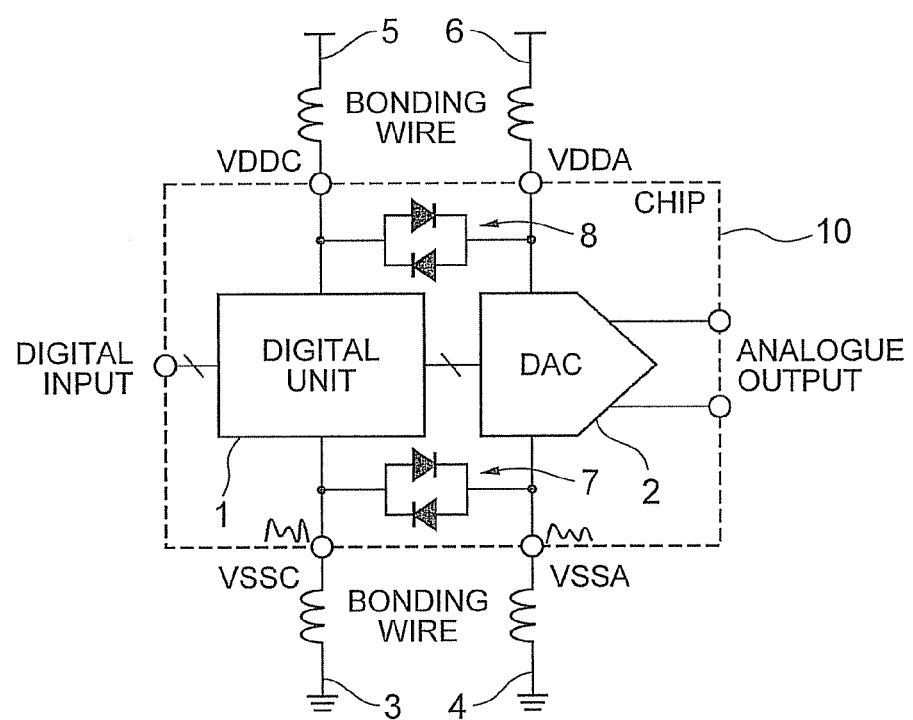
FIG. 12 is a circuit diagram showing a mixed analogue and digital circuit.

FIG. 1 shows the current steering DAC according to a first embodiment. FIG. 12 shows an example of a chip equipped with the DAC of FIG. 1. Instead of the DAC of FIG. 1, the DAC according to other embodiments described later may be used.

The chip of FIG. 12 is a mixed analogue and digital circuit equipped with a digital unit 1 for inputting digital signals into a DAC 2.

A ground VSSC of the digital unit 1 and a ground VSSA of the DAC 2 are connected to a board with bonding wires 3, 4. A ground line of the digital unit 1, and a ground line of the DAC 2 are connected to each other through a back-to-back diode 7. The back-to-back diode is configured by arranging reversed diode elements in parallel. The back-to-back diode is provided for electrostatic prevention, and prevents electrostatic from entering the DAC 2 from the board through the bonding wire 4, for example.

A power terminal VDDC of the digital unit 1, and a power terminal VDDA of the DAC 2 are connected to an identical power source with bonding wires 5, 6. The VDDC and the VDDA may be connected to different power sources. A power line of the digital unit 1 and a power line of the DAC 2 are connected to each other through a back-to-back diode 8.

The digital unit 1 generates differential digital signals depending on a digital input from the external, and applies the differential digital signals to the DAC 2. The DAC 2 includes one or more power source switch cells (see FIG. 1). The digital unit 1 applies differential digital signals to a pair of differential transistors included in each power source switch cell. The differential digital signals are complementary signals, and when the signal on one side is a voltage of the first power source (VDDA), the signal on the other side is a voltage of the second power source (VSSA). Actually, the differential signals from the digital unit 1 are connected through switches (not shown) to gates of the pair of the differential transistors in each power source switch cell. This means that the first power source and the second power source are changed over depending on the input signals. The DAC 2 converts digital signals provided from the digital unit 1 into analogue signals and outputs the analogue signals.

At this time, since the bonding wires 3, 4 contain inductance components, variation in voltage occurs at both ends thereof every time the AC currents flow. In the configuration of FIG. 12, during the operation of the digital unit 1, the currents flowing through the digital circuit flow in the inductance of the bonding wire 3, so that variation in voltage occurs on the VSSC. This variation in voltage is propagated as noises through the back-to-back diode 7 in the chip to the ground VSSA of the DAC 2. The noise components cannot be removed in the conventional DAC, and consequently the noise components are contained in the output signals, as mentioned above.

The DAC 2 of the present embodiment effectively reduces such noises, and outputs analogue signals in which the noise components are removed or reduced. Detailed description will be provided on the DAC 2 of FIG. 1, hereinafter.

As shown in FIG. 1, the N (N is an integer of 1 or more) current switch cells are connected in parallel. The N current switch cells are configured by the current sources $M_{B1}$ to $M_{BN}$, and switch transistors $M_{1P}$ to $M_{NP}$, $M_{1N}$ to $M_{NN}$.

Each of the current sources $M_{B1}$ to $M_{BN}$ has the control terminal that can control the amount in accordance with the input voltage signals. One ends of the current sources $M_{B1}$ to $M_{BN}$ are connected to the first power source (VDDA).

The respective source ends of the switch transistors $M_{1P}$ to $M_{NP}$, $M_{1N}$ to $M_{NN}$ are connected to the other ends of the power sources $M_{B1}$ to $M_{BN}$.

Differential digital signals $D_{i1+}$ to $D_{iN+}$, $D_{i1-}$ to $D_{iN-}$ from the digital unit 1 are input into the gate terminals of the switch transistors $M_{1P}$ to $M_{NP}$, $M_{1N}$ to $M_{NN}$. For example, when the signal from the first power source (VDDA) is input into the switch transistor $M_{1P}$, the signal from the second power source (VSSA) is input into the switch transistor $M_{1N}$. The switch transistors $M_{1P}$ to $M_{NP}$ respectively operate with switch transistors $M_{1N}$ to $M_{NN}$ as a pair of the differential transistors.

Drain terminals of the switch transistors $M_{1P}$ to $M_{NP}$ are connected to one another at the first combining node. Drain currents of the switch transistors $M_{1P}$ to $M_{NP}$ are combined at the first combining node. As similar to other embodiments as described later, the drain terminals may be connected to the first combining node through other elements (such as transistors). The combined current is output from a differential output terminal $V_{o+}$ (first output terminal) as the first signal corresponding to an output impedance element $R_{outP}$. One end of the output impedance element $R_{outP}$ is connected to a differential output terminal $V_{o+}$, and the other end thereof is connected to the VSSA. In this case, a resistor is used as the output impedance element $R_{outP}$. Another element such as a low pass filter and a transimpedance amplifier may be used.

Similarly, the drain terminals of the switch transistors $M_{1N}$ to $M_{NN}$ are connected to one another at the second combining node. The drain currents from the switch transistors $M_{1N}$ to $M_{NN}$ are combined at the second combining node. As similar to other embodiments described later, the drain terminals may be connected to the second combining node through other elements (such as transistors). The combined current is output as the second signal corresponding to an output impedance element $R_{outN}$ from a differential output terminal $V_{o-}$ (second output terminal). One end of the output impedance element $R_{outN}$ is connected to the differential output terminal $V_{o-}$, and the other end thereof is connected to the VSSA. In this case, a resistor is used as the output impedance element $R_{outN}$. Another element such as a low pass filter and a transimpedance amplifier may be used.

The first signal and the second signal output from the differential output terminals $V_{o+}$, $V_{o-}$ are the analogue output signals (differential signals) as a result of the AD conversion.

The controller including a noise detector 13 and a differentiator 14 controls each current source so as to reduce variation in a current flowing from the power source (first power source) VDDA. Specifically, the controller applies a negative feedback to the current sources $M_{B1}$ to $M_{BN}$ such that the current flowing from the first power source have a constant value, that is, the difference between the current and a reference current Iref becomes 0. Specifically, the noise detector 13 generates a signal representing the current flowing from the power source VDDA, and the differentiator 14 calculates a difference between the output from the noise detector 13 and the reference current Iref, and inputs the calculated result into the control terminals of the current sources $M_{B1}$ to $M_{BN}$. Accordingly, noise components can be prevented from being mixed in the output signals.

Hereinafter, description will be provided on the circuit operation with no feedback by the controller (the noise detector 13 and the differentiator 14), and on the noise reducing operation using the feedback by the controller. The operation with no feedback will now be described.

The current flowing the current source $M_{B1}$ is distributed to one of the differential output terminals $V_{o+}$ and $V_{o-}$ by the two switch transistors $M_{1P}$ and $M_{1N}$. The same operation is executed in the other current switch cells. The currents from the respective current switch cells are added at the differential output terminals $V_{o+}$, $V_{o-}$, so as to generate analogue signals of the currents. The currents are converted into voltages by the output resistors $R_{outP}$, $R_{outN}$. In this manner, the signals input as digital values into the DAC are converted into analogue signals.

Herein, it is assumed that digital signal $D_{i1+}$ is connected to the VSSA (second power source), and digital signal $D_{i1-}$ is connected to the VDDA (first power source).

Noises are propagated from the digital unit 1 through the back-to-back diode 7 (see FIG. 12) to the VSSA, and the noises are then input into the gate of the switch transistor $M_{1P}$.

At this time, a source follower for the gate input of the switch transistor $M_{1P}$ is generated by the switch transistor $M_{1P}$ and the current source $M_{B1}$ (the switch transistor $M_{1N}$ is OFF at this time), the noises input into the gate of the switch transistor $M_{1P}$ are output at the gain of approximately 1 to a node $X_1$ that is a connecting point of the source terminals of the switch transistors $M_{1P}$ and $M_{1N}$.

Consequently, the potential difference between the node $X_1$ and the VDDA is varied, and noise current $I_{c1}$ are supplied through a parasitic capacitance $C_{db1}$. Hence, the current flowing to the $V_{o+}$ become $I_{B1}+I_{c1}$, which is a value including the noise currents. Meanwhile, the switch transistor $M_{1N}$ is OFF, so that the current flowing to the $V_{o-}$ become 0. Hence, the noise current $I_{c1}$ cannot be cancelled by the differential operation. In this way, the digital input signals $D_{i1+}$, $D_{i1-}$ have different frequencies, and thus a signal in which a frequency of a signal including the noises and a frequency of a digital input signal are mixed is output at the output terminal $V_{o+}$ or $V_{o-}$. In other words, the output signals include the noise components.

In this case, the first current switch cell is explained as an example of the present embodiment, but the same operation is carried out in the other cells.

In the present embodiment, the noise detector 13 and the differentiator 14 control the current sources $M_{B1}$ to $M_{BN}$ so as to reduce the variation in (to constantly maintain) the total current from the VDDA, that is, so as to reduce the variation of $I_{B1}+I_{B2}+\ldots+I_{BN}+I_{c1}+I_{c2}+\ldots+I_{cN}$.

Specifically, the respective current sources are controlled so as to set the difference between the total current and the reference current Iref to be 0, or so as to be as close as possible to 0. The reference current Iref is equivalent to the sum of the currents to be flowed from the current sources $M_{B1}$ to $M_{BN}$ if the parasitic capacitances are completely ignored.

This configuration can prevent the variation in currents flowing to the output voltage terminals due to the propagation of the noises. Accordingly, influences of the noises on the output voltage terminals $V_{o+}$, $V_{o-}$ can be reduced.

Conventionally, in the case where the digital unit and the current steering DAC are integrated into one chip, a spurious signal is generated in the output from the DAC due to noises resulted from the operation of the digital unit, which leads to deterioration of resolution; however, the above configuration of the embodiment can prevent the deterioration of resolution.

The present embodiment uses the feedback principle, and thus does not depend on the matching among the elements. It is thus possible to reduce the influences of the power source noises as far as the loop gain can be sufficiently secured. According to the present embodiment, it is possible to securely reduce the noise components with a simple configuration.

(Second Embodiment)

Figure 2:
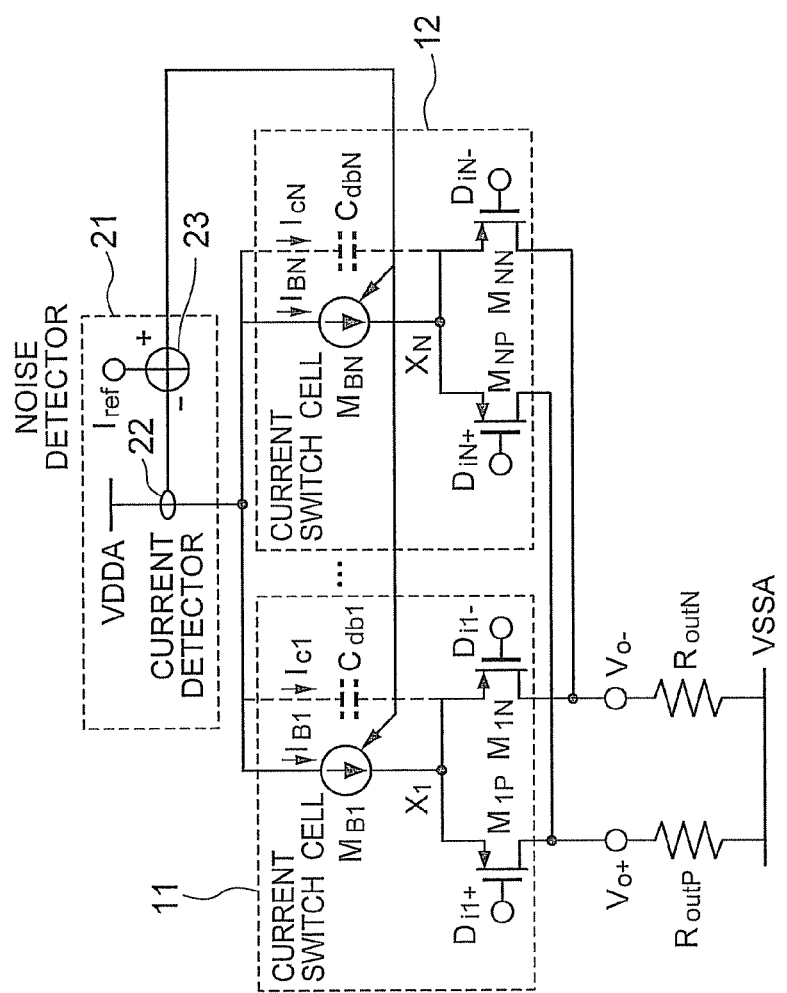
FIG. 2 is a circuit diagram showing a configuration example of detecting a current flowing from a power source.

FIG. 2 shows the DAC according to a second embodiment, and also shows the specific configuration of the controller (the noise detector and the differentiator) of FIG. 1.

As described above, since one of the transistors $M_{1P}$ and $M_{1N}$ is connected to the VSSA, the AC components of the VSSA are propagated to the node $X_1$ because of the source follower principle. The noise currents $I_{c1}$ flow due to pseudo AC potential difference generated between the VDDA and the node $X_1$.

The current flowing from the VDDA are detected at a current detector 22 of a noise detector 21, and the reference DC current $I_{ref}$ are subtracted from the detected current by a subtracter 23. In this way, the noise current resulted from the noise voltage generated between the VDDA and the VSSA are detected. The negative feedback is applied to each current source $M_{B1}$ to $M_{BN}$ with the detected noise current. In this manner, the feedback is applied such that the total current flowing from the power source VDDA becomes $I_{B1}+I_{B2}+\ldots+I_{BN}+I_{c1}+I_{c2}+\ldots+I_{cN}=I_{ref}$.

The detection of the current output from the VDDA is used for detecting the noises generated between the VDDA and the VSSA, thereby reducing the influence of the noises on the $V_{o+}$ and the $V_{o-}$.

Figure 3:
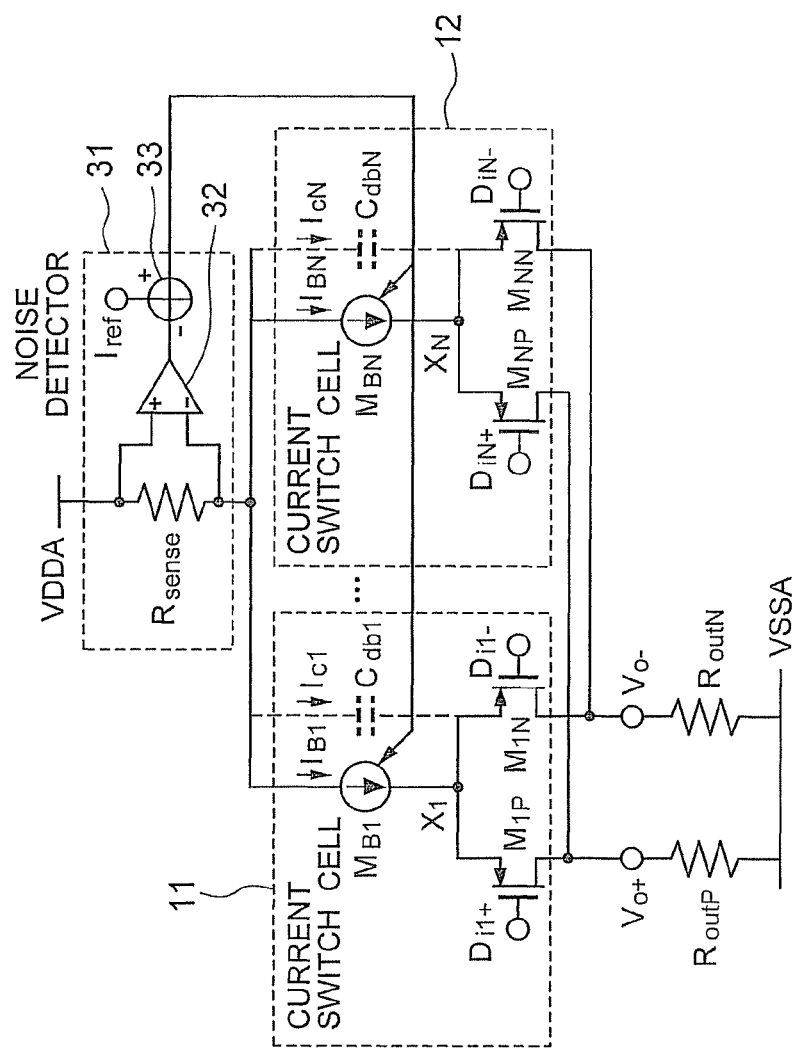
FIG. 3 is a circuit diagram showing a configuration example of detecting the amount of a current through a resistance element.

FIG. 3 shows a circuit diagram in which the current detector 22 is embodied in the circuit of FIG. 2. A resistance element $R_{sense}$ is inserted between the power source VDDA and the current sources $M_{B1}$ to $M_{BN}$. The potential difference between the both ends of the resistance element is measured by a comparator 32, and the amount (magnitude) of the current flowing from the power source VDDA is measured based on the measured potential difference. The measured amount of current is compared to the reference current $I_{ref}$, thereby performing the same control as the aforementioned control.

(Third Embodiment)

Figure 4:
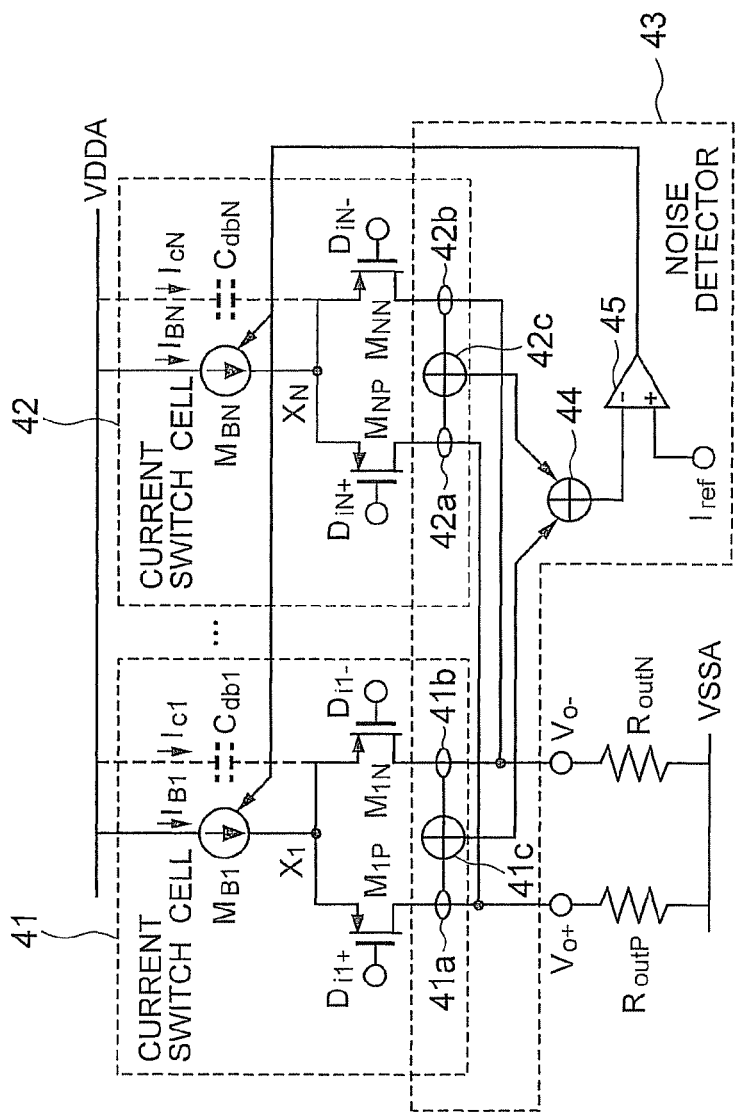
FIG. 4 is a circuit diagram showing a configuration example of a current detection in each current switch cell.

FIG. 4 shows the DAC according to a third embodiment. This drawing shows a configuration of performing the current detection in each current switch cell.

Figure 6:
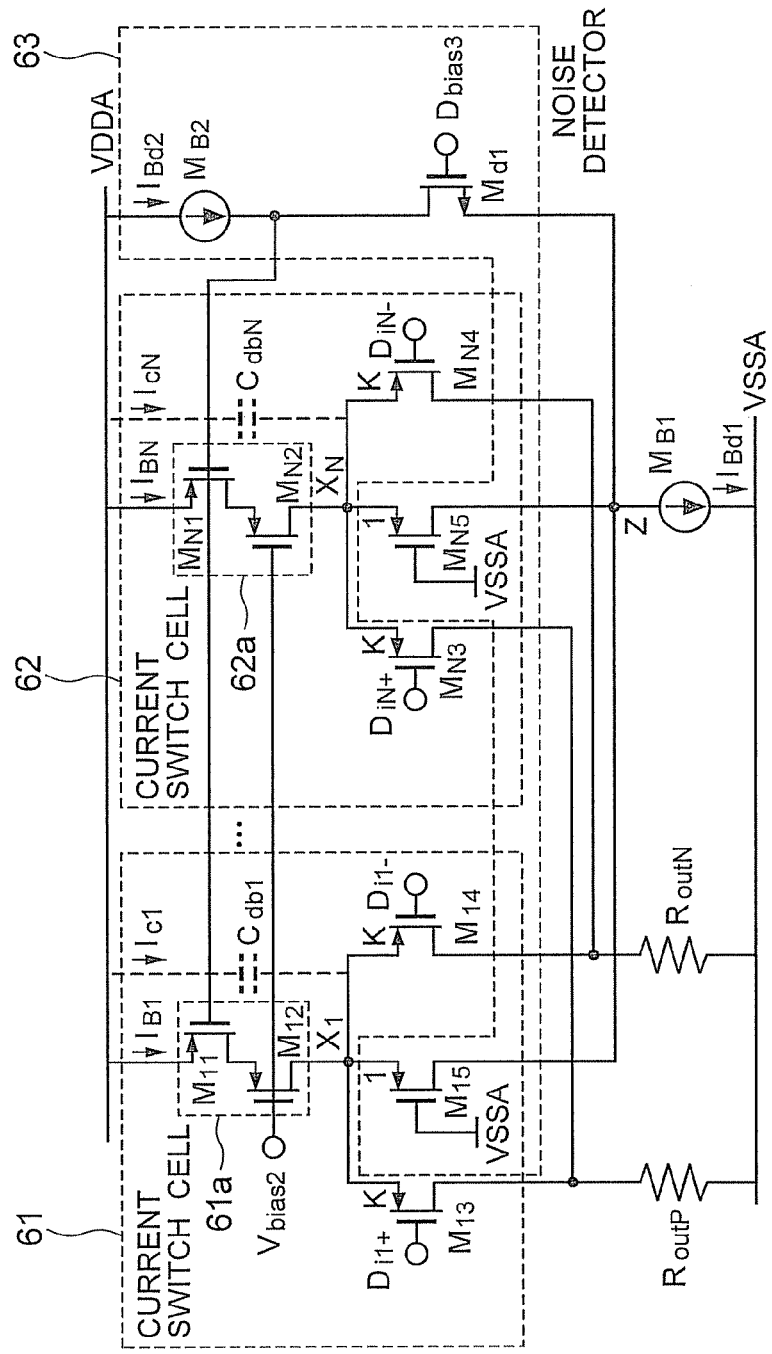
FIG. 6 is a circuit diagram showing a configuration example of a current detection through one current distributing circuit.
Figure 7:
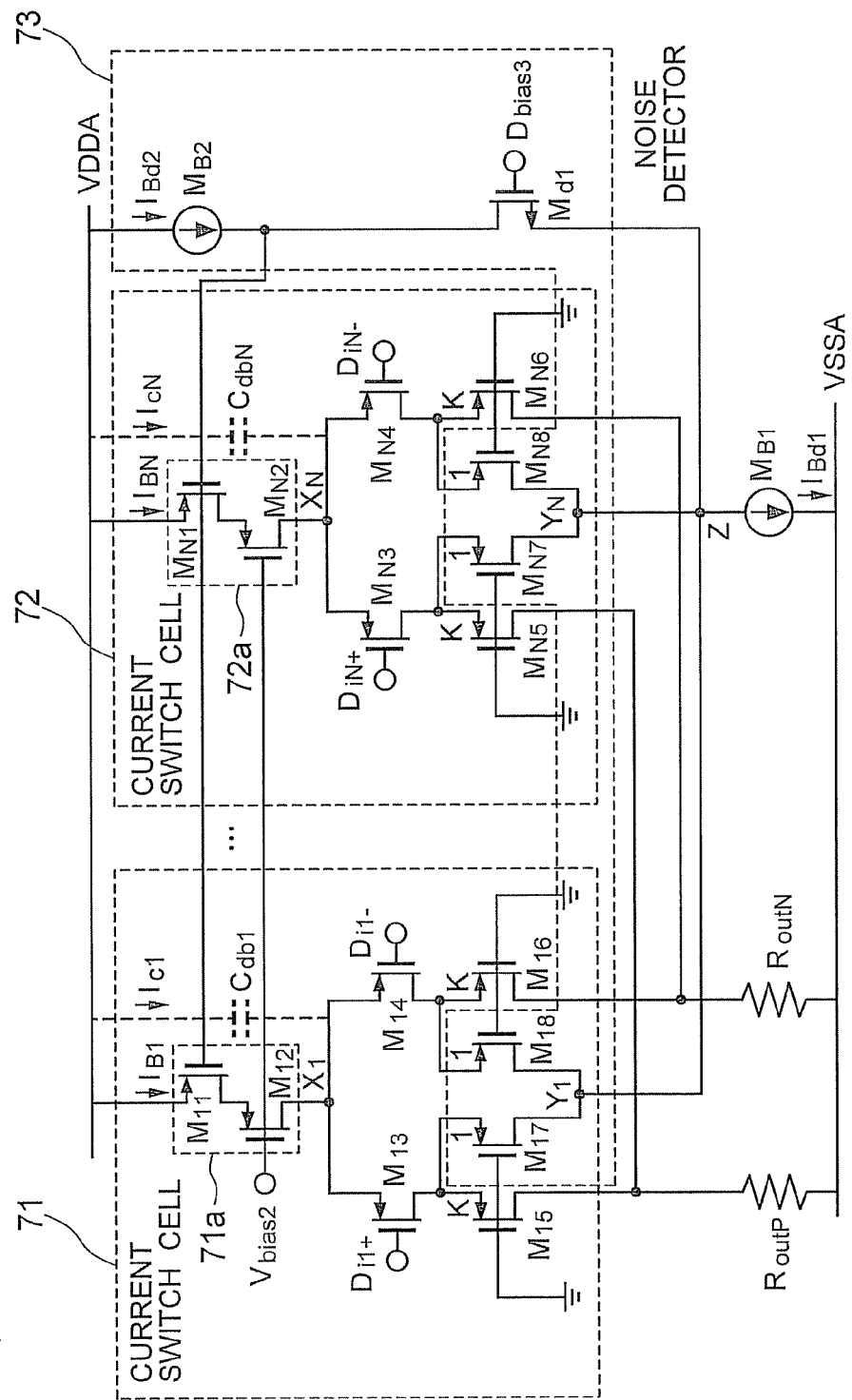
FIG. 7 is a circuit diagram showing a configuration example of a current detection through cascode transistors.

The currents flowing through the switch transistors $M_{1P}$ to $M_{NP}$ and $M_{1N}$ to $M_{NN}$ are measured at respective current detectors 41a to 42a (first current detector) and 41b to 42b (second current detector). In each current switch cell, the sum of the currents flowing to the differential switch transistors, that is, $M_{1P}+M_{1N}$, $M_{2P}+M_{2N}$... is measured at each of adders 41c to 42c. These sums are added at an adder 44 (first adder) outside the adders of the switch cells, and the output value from the adder 44 is compared to the reference current $I_{ref}$ at the comparator 45. A feedback is performed such that the total current flowing from the power source VDDA becomes $I_{B1}+I_{B2}+\ldots+I_{BN}+I_{c1}+I_{c2}+\ldots+I_{cN}=I_{ref}$. Accordingly, the influences of the noises on the $V_{o+}$, $V_{o-}$ can be reduced. Examples of the more specific configuration are shown in FIGS. 5, 6 and 7.

Figure 5:
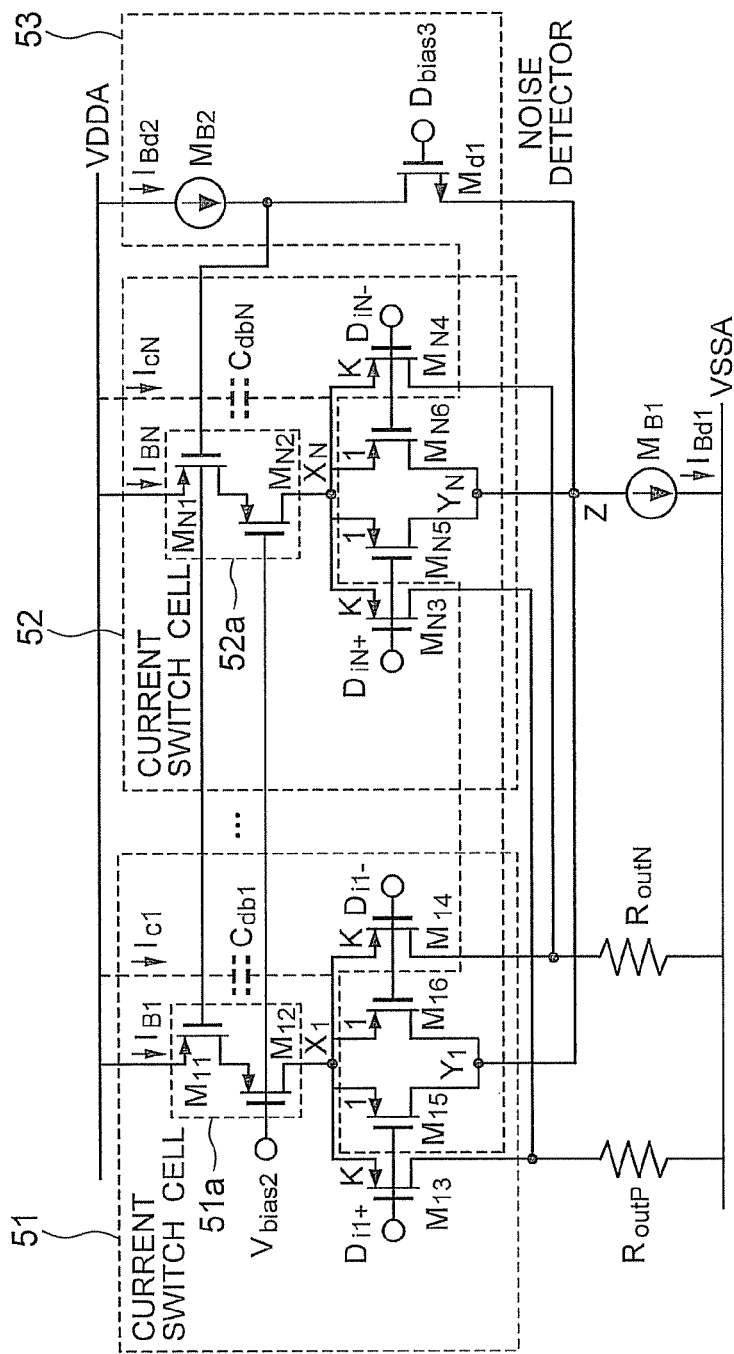
FIG. 5 is a circuit diagram showing a configuration example of a current detection through two current distributing circuits.

FIG. 5 shows a configuration example of the current detection through current distributing circuits.

Dummy transistors $M_{15}$ to $M_{N5}$, $M_{16}$ to $M_{N6}$ are further provided as current distributing circuits (first current distributing circuit).

Current sources 51a to 52a are configured by transistors $M_{11}$ to $M_{N1}$ and $M_{12}$ to $M_{N2}$ in a cascode configuration. A bias voltage $V_{bias2}$ is commonly applied to each gate terminal of the transistors $M_{12}$ to $M_{N2}$, so as to enhance the output impedance.

The aspect ratio of the transistor size is defined to be $M_{13}:M_{15}:M_{16}:M_{14}=K:1:1:K$. K may be any value. Through this configuration, 1/K of the current flowing to the transistor $M_{15}$ flows to the transistor $M_{13}$, and 1/K of the current flowing to the transistor $M_{16}$ flows to the transistor $M_{14}$. The aspect ratio is also defined in the same manner in the second and following current switch cells.

At each node $Y_1$ to $Y_N$, the sum of the differential currents in each current switch cell (the current flowing through each of transistors $M_{15}$ to $M_{N5}$, $M_{16}$ to $M_{N6}$) is calculated. At the node Z (first node), the currents in the nodes $Y_1$ to $Y_N$ are added.

A gate grounded amplification stage (gate grounded amplifier) is configured by a current source $M_{B2}$ and a transistor $M_{d1}$. A difference between the current obtained at the node Z and current $I_{Bd1}$ of the current source $M_{B1}$ is amplified by this gate grounded amplifier, and this is input into the gates of the transistors $M_{11}$ to $M_{N1}$ of respective current sources. The output voltage of the gate grounded amplifier (voltage at the connecting point between the current source $M_{B2}$ and the drain terminal of the transistor) is applied to the transistors $M_{11}$ to $M_{N1}$ of respective current sources. As the noises are increased, the output voltage is increased, and the currents flowing through the transistors $M_{11}$ to $M_{N1}$ are decreased.

The amplification in this manner enhances the loop gain, thereby enhancing the reduction of the noises. Through this configuration, the sum total of the currents flowing through the respective current switch cells is controlled to accord with the reference current defined by the current sources $M_{B1}$ and $M_{B2}$. Specifically, the control is provided so as to be $(I_{B1}+I_{B2}+\ldots+I_{BN}+I_{c1}+I_{c2}+\ldots+I_{cN})/(K+1)=I_{Bd1}-I_{Bd2}$. Accordingly, the influences of the power source noises on the output terminals $V_{o+}$, $V_{o-}$ can be reduced.

FIG. 6 shows another configuration example of the current detection through the current distributing circuits.

In the configuration of FIG. 5, one of the transistors $M_{13}$ and $M_{14}$ is OFF, therefore, one of the transistors $M_{15}$ and $M_{16}$ is also OFF. Meanwhile, in the configuration of FIG. 6, the current detection is carried out by the transistor $M_{15}$ having a gate terminal connected to the VSSA. Accordingly, only a single transistor allows the operation equivalent to that of in FIG. 5. At this time, the aspect ratio of the transistor size is defined to be $M_{13}:M_{15}:M_{14}=K:1:K$. K may be any value. In this case, the first cell is explained as an example of the present embodiment, but the same operation is carried out in the other cells. The currents taken out at the transistors $M_{15}$ to $M_{N5}$ are added at the node Z. The subsequent operation is the same as that of in FIG. 5.

FIG. 7 shows an example of the current distributing circuits configured by cascode transistors.

In this circuit, the cascode transistors $M_{15}$, $M_{16}$ are connected to the drain terminals of the switch transistors $M_{13}$, $M_{14}$, and the respective gate terminals are connected to the VSSA. Transistors $M_{17}$, $M_{18}$ are connected to the transistors $M_{15}$, $M_{16}$ in parallel, and their gate terminals are connected to the VSSA. At this time, the aspect ratio of the transistor size is defined to be $M_{15}:M_{17}:M_{18}:M_{16}=K:1:1:K$. In this case, the first cell is explained as an example of the present embodiment, but the other cells have the similar configuration. At each node $Y_1$ to $Y_N$, the sum of the current flowing through each of the transistors $M_{17}$ to $M_{18}$, and $M_{N7}$ to $M_{N8}$ in each current switch cell is calculated. At the node Z (second node), the currents in the nodes $Y_1$ to $Y_N$ are added. The subsequent operation is the same as the operation in FIG. 5.

(Fourth Embodiment)

Figure 8:
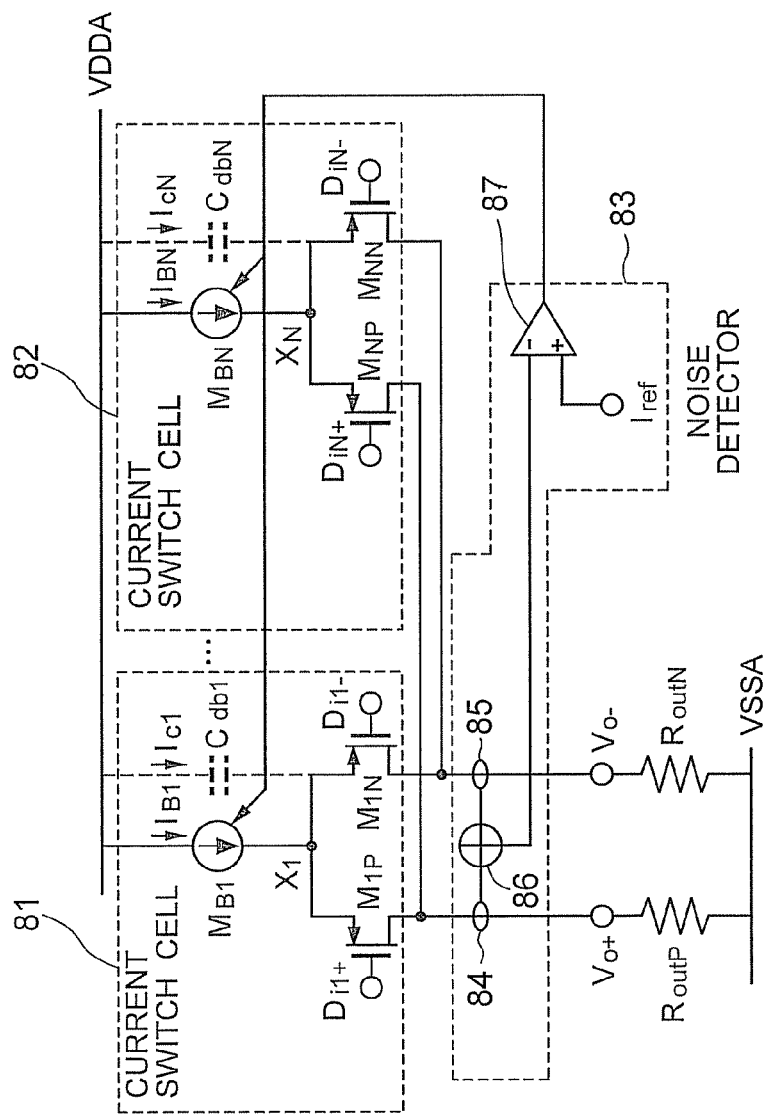
FIG. 8 is a circuit diagram showing a configuration example of detecting currents flowing to output resistors.

FIG. 8 shows a configuration of detecting of the currents flowing to the output resistors $R_{outP}$, $R_{outN}$.

In this case, the currents flowing to the output resistors $R_{outP}$, $R_{outN}$ are detected at current loops 84, 85 (the fourth current detector and the fifth current detector). The sum of the detected currents are calculated at an adder 86 (second adder). The summed current added at the adder 86 are compared to the reference currents $I_{ref}$ at a comparator 87, so as to obtain a difference current. The negative feedback is applied to the current sources $M_{B1}$ to $M_{BN}$ with a signal of the difference current. In this manner, the summed current is controlled to be equal to the reference current $I_{ref}$. Accordingly, the influences of the power source noises on the output terminals $V_{o+}$, $V_{o-}$ can be reduced.

Figure 9:
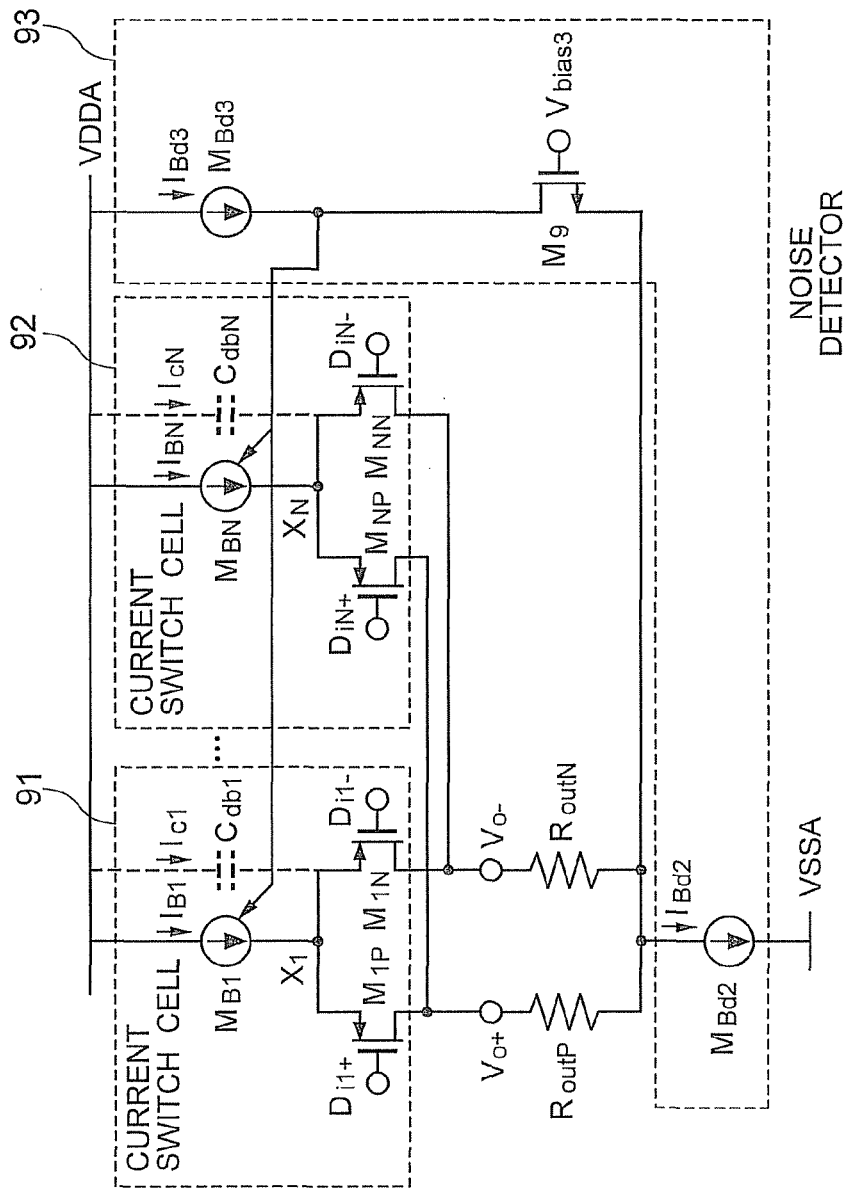
FIG. 9 is a circuit diagram showing a configuration of amplifying currents flowing to the output resistors through a gate grounded amplification stage.

FIG. 9 shows a configuration of detecting current noises by connecting a current source $M_{Bd2}$ to the terminal on the VSSA side of the output resistors $R_{outP}$, $R_{outN}$.

The gate grounded amplifying stage is configured by a power source $M_{Bd3}$ and the transistor $M_9$. The sum of the currents flowing to the output resistors $R_{outP}$, $R_{outN}$ is obtained at the connecting point (third node) between the other ends of the output resistors $R_{outP}$, $R_{outN}$, and the difference between the sum of the currents and a current $I_{Bd2}$ flowing from the current source $M_{Bd2}$ is input into the gate grounded amplification stage. The output voltage of the gate grounded amplification stage is input into the control terminals of the current sources $M_{B1}$ to $M_{BN}$. In this manner, the sum of the currents flowing the output resistors $R_{outP}$, $R_{outN}$ is controlled to be $I_{Bd2}-I_{Bd3}$. Accordingly, the influences of the power source noises on the output terminals $V_{o+}$, $V_{o-}$ are reduced.

Figure 10:
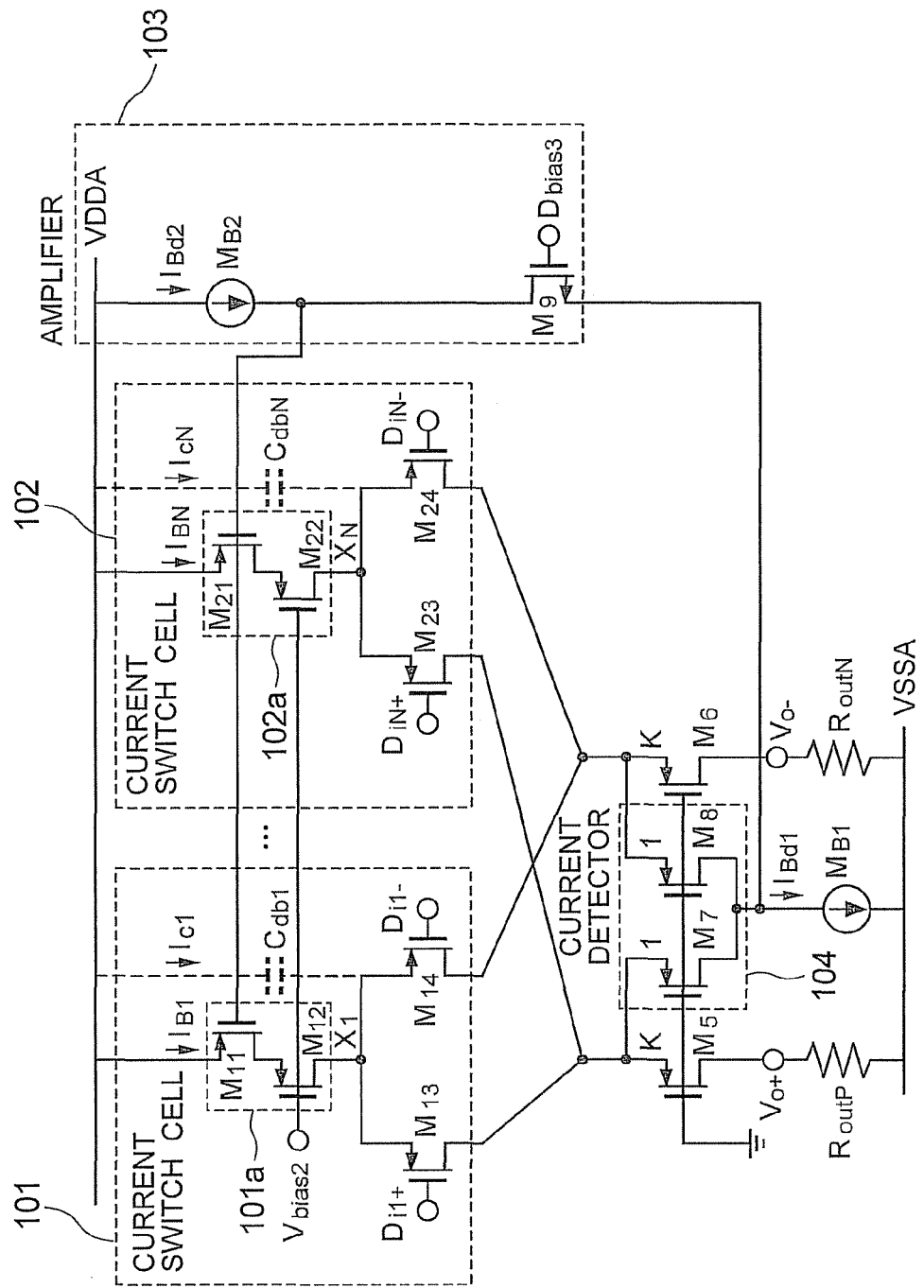
FIG. 10 is a circuit diagram showing another configuration example of carrying out the current detection through a current distributing circuit.

FIG. 10 shows a circuit for the current detection through the current distributing circuit. The current distributing circuit is provided for each current switch cell in the configurations of FIGS. 5, 6 and 7. A common current distributing circuit is provided among the current switch cells in the configuration of FIG. 10.

Each drain terminal of the switch transistors $M_{13}$ to $M_{23}$, $M_{14}$ to $M_{24}$ included in the respective current switch cells is short-circuited, and is connected to the sources of the cascode transistors $M_5$, $M_6$. The transistors $M_7$, $M_8$ are connected to the transistors $M_5$, $M_6$ in parallel. This connection allows parts of the currents flowing to the transistors $M_5$, $M_6$ to flow to the transistors $M_7$, $M_8$. The aspect ratio of the transistor size is adjusted to be $M_5:M_7:M_8: M_6=K:1:1:K$. K may be any value. The transistors $M_7$ and $M_8$ form a third current distributing circuit that takes out parts of the currents flowing through the output resistors $R_{outP}$, $R_{outN}$.

The currents flowing through the transistors $M_7$, $M_8$ are summed at the connecting point (fourth node) of the drain terminals of the transistors $M_7$, $M_8$, and the summed current are amplified at the gate grounded amplification stage configured by the current source $M_{Bd2}$ and the transistor $M_9$. The output from the gate grounded amplification stage is then fed back to each current source. Through this configuration, the sum of the currents flowing through the transistors $M_7$, $M_8$ is controlled to be $I_{Bd1}-I_{Bd2}$. Accordingly, the influences of the power source noises on the output terminals $V_{o+}$, $V_{o-}$ can be reduced.

(Fifth Embodiment)

Figure 11:
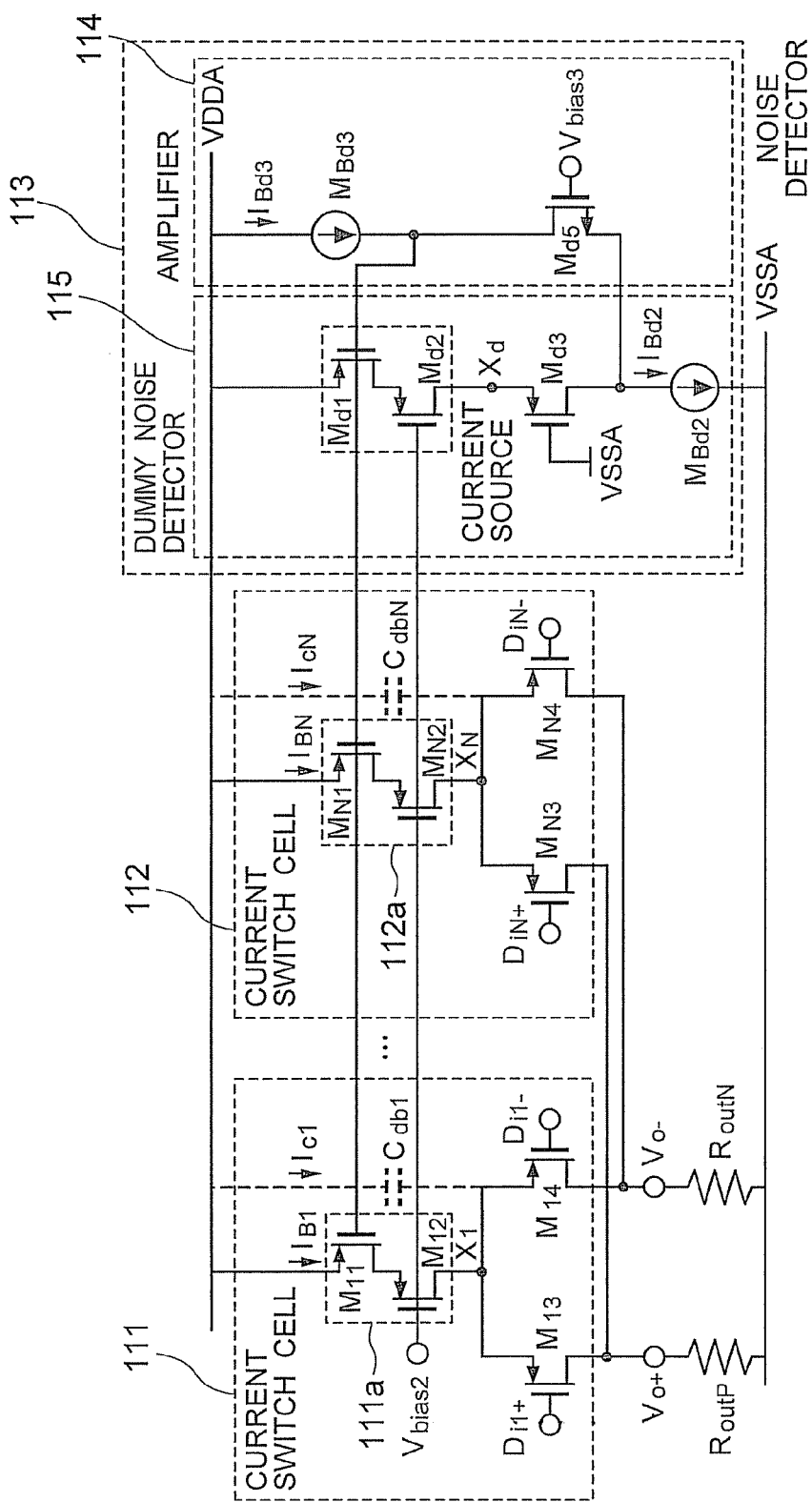
FIG. 11 is a circuit diagram showing a configuration example of using a dummy circuit which flows a current in proportion to currents of a current source of each current switch cell.

FIG. 11 shows the DAC according to a fifth embodiment.

The current sources of the respective switch cells are configured by the transistors $M_{11}$ to $M_{N1}$, $M_{12}$ to $M_{N2}$ in the cascode configuration.

A current source of a dummy noise detector 115 (dummy current source) is configured by transistors $M_{d1}$, $M_{d2}$ in the cascode configuration. A source of a transistor (dummy current detector) $M_{d3}$ is connected to the dummy current source. Its connecting point corresponds to a node $X_d$. The gate terminal of the transistor $M_{d3}$ is connected to the VSSA, so as to detect the current of the node $X_d$, that is, the current of the dummy current source. The difference between the detected current and the current $I_{Bd2}$ of the current source $M_{Bd2}$ is applied to an amplifier 114.

The amplifier 114 is a gate grounded amplifier configured by a current source $M_{B3}$ and a transistor $M_{d5}$. The amplifier 114 amplifies the current applied from the dummy noise detector 115, and feeds back the amplified current to the current source of each current switch cell and to the dummy current source. Specifically, the current flowing to the node $X_d$ is controlled to be equal to the reference current ($I_{Bd2}-I_{Bd3}$). At this time, the aspect ratio of the transistor size is set to be $M_{11}:M_{d1}=K:1$, $M_{12}:M_{d2}=K:1$, $M_{13}(=M_{14}):M_{d3}=K:1$. The same aspect ratio is also defined for each of the other power source switch cells. The current switch cells may have different values of K, or may have the same value of K among them. As a result, the currents flowing to the nodes $X_1$ to $X_N$ of the respective power source switch cells are controlled to be $K(I_{Bd2}-I_{Bd3})$. Accordingly, the influences of the power source noises on the output terminals $V_{o+}$, $V_{o-}$ can be reduced.

The above embodiments have been explained by using an example of MOSFETs, but various types of transistors may be used instead of using MOSFETs. Bipolar transistors may also be used, for example. If the bipolar transistors are used, the connecting points of the gate, the source, and the drain of the MOSFET may correspond to the connecting points of the base, the emitter, and the collector of the bipolar transistor, respectively. If other transistors are used, the connecting points of the gate, the source, and the drain of the MOSFET may correspond to the connecting points of the control terminal, one end, and the other end of the transistor, respectively.

Depending on the type of a transistor to be used, the control terminal of the transistor may correspond to the gate of a MOSFET, and the base of a bipolar transistor; one end of the transistor may correspond to the source of the MOSFET, and the emitter of the bipolar transistor; and the other end thereof corresponds to the drain of the MOSFET, and the corrector of the bipolar transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A DA converter comprising:
N (N is an integer of 1 or more) current switch cells each comprising:
a current source comprising one end connected to a first power source configured to generate a controllable current; and
a first switch transistor and a second switch transistor differentially operating each other, each comprising one end connected to another end of the current source and a control terminal configured to receive a digital signal;
a first combining node configured to combine currents output from another end of the first switch transistor in each current switch cell;
a second combining node configured to combine currents output from another end of the second switch transistor in each current switch cell;
a first output impedance element comprising one end connected to the first combining node and another end connected to a second power source;
a second output impedance element comprising one end connected to the second combining node and another end connected to the second power source; and
a controller comprising a first current detector configured to detect the current flowing at each current switch cell and controlling the current source in each current switch cell to reduce variation in a total current flowing from the first power source on basis of the current detected by the first current detector.

2. The DA converter of claim 1, wherein
the first current detector comprises, for each of the current switch cells, a second current detector configured to detect a current flowing from the other end of the first switch transistor and a third current detector configured to detect a current flowing from the other end of the second switch transistor; and
the controller comprises a first adder configured to sum up all of the current detected at the second current detector and the current detected at the third current detector in each current switch cell, and
the controller is configured to control the current source in each current switch cell according to a difference between a summed current and a reference current.

3. The DA converter of claim 1, wherein
the first current detector comprises, for each of the current switch cells, a first current distributing circuit configured to take out a part of the current flowing from the current source; and
the controller comprises a first node configured to combine currents taken out by the first current distributing circuit in each current switch cell, and
the controller is configured to control the current source in each current switch cell according to a difference between a combined current at the first node and a reference current.

4. The DA converter of claim 1, wherein
the first current detector comprises, for each of the current switch cells, a second current distributing circuit configured to take out parts of currents flowing from the other ends of the first switch transistor and the second switch transistor;
the controller comprises a second node configured to combine all of currents taken out by the second current distributing circuit in each current switch cell, and
the controller is configured to control the current source in each current switch cell according to a difference between a combined current obtained at the second node and a reference current.

5. The DA converter of claim 1, wherein
the controller comprises a third node configured to combine currents flowing through the first output impedance element and the second output impedance element, and
the controller is configured to control the current source in each current switch cell according to a difference between a combined current at the third node and a reference current.

6. The DA converter of claim 1, wherein
the controller comprises:
a dummy current source comprising one end connected to the first power source; and
a dummy current detector connected to another end of the dummy current source, configured to detect a current flowing through the dummy current source,
and
the controller configured to control the current source in each current switch cell and the dummy current source according to a difference between the current detected at the dummy current detector and a reference current.

7. A DA converter comprising;
N (N is an integer of 1 or more) current switch cells each comprising:
a current source comprising one end connected to a first power source configured to generate a controllable current; and
a first switch transistor and a second switch transistor differentially operating each other, each comprising one end connected to another end of the current source and a control terminal configured to receive a digital signal;

a first combining node configured to combine currents output from another end of the first switch transistor in each current switch cell;

a second combining node configured to combine currents output from another end of the second switch transistor in each current switch cell;

a first output impedance element comprising one end connected to the first combining node and another end connected to a second power source;

a second output impedance element comprising one end connected to the second combining node and another end connected to the second power source;

a controller configured to control the current source in each current switch cell to reduce variation in a total current flowing from the first power source;

a fourth current detector and a fifth current detector configured to respectively detect currents flowing through the first output impedance element and the second output impedance element; and a second adder configured to sum currents detected at the fourth current detector and at the fifth current detector, wherein the controller is configured to control the current source in each current switch cell according to a difference between a summed current at the second adder and a reference current.

8. A DA converter comprising;

N (N is an integer of 1 or more) current switch cells each comprising:

a current source comprising one end connected to a first power source configured to generate a controllable current; and a first switch transistor and a second switch transistor differentially operating each other, each comprising one end connected to another end of the current source and a control terminal configured to receive a digital signal;

a first combining node configured to combine currents output from another end of the first switch transistor in each current switch cell;

a second combining node configured to combine currents output from another end of the second switch transistor in each current switch cell;

a first output impedance element comprising one end connected to the first combining node and another end connected to a second power source;

a second output impedance element comprising one end connected to the second combining node and another end connected to the second power source; and a controller configured to control the current source in each current switch cell to reduce variation in a total current flowing from the first power source;

wherein the controller comprises:

a third current distributing circuit configured to take out parts of currents flowing through the first output impedance element and the second output impedance element; and a fourth node configured to combine currents taken out by the third current distributing circuit, and the controller is configured to control the current source in each current switch cell according to a difference between a combined current at the fourth node and a reference current.

\* \* \* \* \*